United States Patent [19]
Hawkins

[11] Patent Number: 5,860,210
[45] Date of Patent: Jan. 19, 1999

[54] METHOD OF MANUFACTURING AN ELECTRONIC COMPONENT

[75] Inventor: George W. Hawkins, Gilbert, Ariz.

[73] Assignee: Motorola, Inc., Schaumburg, Ill.

[21] Appl. No.: 723,808

[22] Filed: Sep. 30, 1996

[51] Int. Cl.$^6$ .................................................. H05K 3/36
[52] U.S. Cl. ............................ 29/830; 29/840; 257/712; 361/792; 361/796
[58] Field of Search .................................. 361/792, 796, 361/803; 29/830; 257/712

[56] References Cited

U.S. PATENT DOCUMENTS

| | | | |
|---|---|---|---|
| 4,294,007 | 10/1981 | Ellis, Jr. ....................................... | 29/830 |
| 4,502,098 | 2/1985 | Brown et al. ......................... | 361/796 X |
| 4,823,233 | 4/1989 | Brown et al. ......................... | 361/796 X |
| 4,868,712 | 9/1989 | Woodman ............................. | 361/796 X |
| 5,172,303 | 12/1992 | Bernardone et al. . | |
| 5,220,198 | 6/1993 | Tsuji . | |
| 5,279,029 | 1/1994 | Burns ..................................... | 29/830 X |
| 5,352,851 | 10/1994 | Wallace et al. . | |
| 5,604,377 | 2/1997 | Palagonia . | |

FOREIGN PATENT DOCUMENTS

| | | | |
|---|---|---|---|
| 62-298145 | 12/1987 | Japan ..................................... | 257/712 |
| 3-257990 | 11/1991 | Japan ..................................... | 29/830 |

*Primary Examiner*—Carl J. Arbes
*Attorney, Agent, or Firm*—George C. Chen

[57] ABSTRACT

An electronic component includes a substrate (11) having a device surface (13) and opposite ends (14, 15) adjacent to the device surface (13), an electronic device (16) supported by the device surface (13), and an interconnect substrate (30) overlying a first end (14) of the substrate (11) and electrically coupled to the electronic device (16). The electronic component can be manufactured by inserting the second end (15) of the substrate (11) into one of a plurality of holes (23) in a carrier (20) wherein the device surface (13) and the carrier (20) form an angle greater than approximately five degrees.

21 Claims, 6 Drawing Sheets

METHOD OF MANUFACTURING AN ELECTRONIC COMPONENT

BACKGROUND OF THE INVENTION

This invention relates, in general, to electronic components, and more particularly, to a method of manufacturing and assembling electronic components.

A micromachined accelerometer typically has cantilever arms and a seismic mass that are supported over a surface of a semiconductor substrate. The sensing axis of the seismic mass is usually perpendicular to the surface of the semiconductor substrate. After fabrication, the accelerometer is typically mounted onto an assembly board wherein the surface of the semiconductor substrate is parallel to the assembly board surface. In this configuration, the sensing axis of the accelerometer is perpendicular to the assembly board, and the accelerometer can be referred to as a "perpendicular axis" accelerometer. The fabrication and assembly procedure for a "perpendicular axis" accelerometer is expensive, and the "perpendicular axis" accelerometer consumes a large footprint on the assembly board. Techniques for manufacturing "parallel axis" accelerometers are even more expensive and more complicated than those used for "perpendicular axis" accelerometers.

Accordingly, a need exists for a method of manufacturing an electronic component that is manufacturable, that is cost-effective, and that is not complicated. Furthermore, the electronic component should only require a small footprint on an assembly board.

DETAILED DESCRIPTION OF THE DRAWINGS

Figure 1:
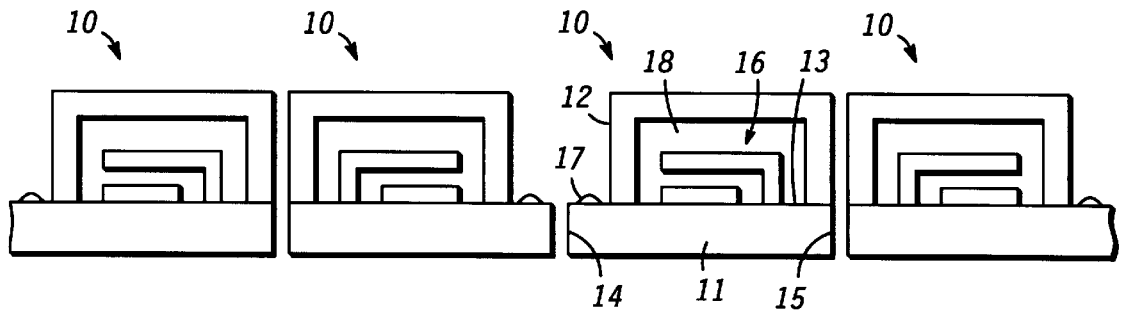
FIG. 1 illustrates a partial cross-sectional view of a plurality of electronic components in accordance with the present invention.

FIG. 1 illustrates a partial cross-sectional view of a plurality of electronic devices or components 10. In the preferred embodiment, components 10 are micromachined accelerometers, but it is understood that components 10 can be any type of electronic component including, but not limited to, sensors, power transistors, or integrated circuits. Components 10 include and are supported by a device substrate 11, which can be comprised of a semiconductor material such as, for example, silicon or gallium arsenide. Substrate 11 has a device surface 13 that supports active devices 16. In the preferred embodiment, each of devices 16 can include micromachined cantilever arms, a seismic mass, and a sensing electrode. Because devices 16 can have many different structures, the depicted structure is only for the purpose of illustrating devices 16. The specific embodiments and fabrication techniques of devices 16 are known to those skilled in the art. It is understood that devices 16 can alternatively be integrated circuits, power transistors, chemical sensors, or the like.

A protective or capping substrate 12 is positioned over surface 13. Substrate 12 has a plurality of recesses 18 that are formed using conventional etching processes. Recesses 18 are aligned to devices 16 to protect devices 16 from physical or other damage. Substrate 12 is preferably comprised of a material that is similar to substrate 11 to reduce problems associated with thermal expansion and contraction. Substrate 12 can be physically coupled to substrate 11 using fritted glass or another suitable adhesive.

After adhering substrate 12 to substrate 11 and after patterning substrate 12, a plurality of electrical contacts 17 is formed over a portion of substrate surface 13 and is electrically coupled to devices 16. As an example, contacts 17 can be comprised of gold, copper, or the like and can be fabricated using flip chip or other contact formation techniques known in the art.

Next, components 10 are singulated across substrate 11 and are physically separated from each other. Thus, each of components 10 has opposite side surfaces or ends 14 and 15 wherein contacts 17 are adjacent to end 14 and are absent near end 15. The singulation process can be accomplished using laser, sawing, or other techniques.

Figure 2:
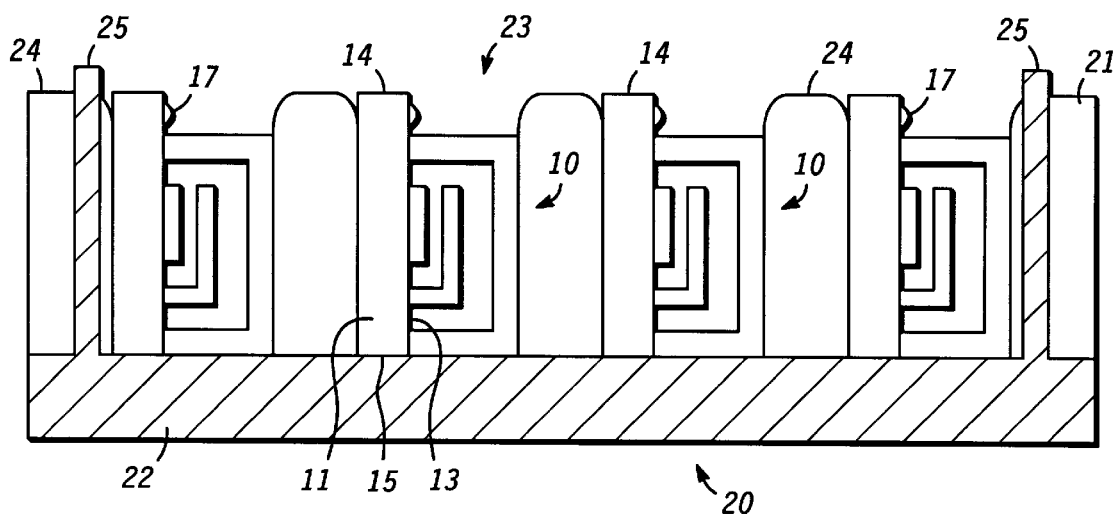
FIG. 2 portrays a cross-sectional view of a carrier supporting a portion of the plurality of electronic components in accordance with the present invention.

FIG. 2 portrays a cross-sectional view of a carrier 20 supporting a portion of components 10. Elements of FIG. 2 that have the same reference numerals as FIG. 1 are the same as the corresponding FIG. 1 elements. In a manufacturing environment, carrier 20 can hold approximately one hundred to ten thousand individual components. Carrier 20 includes an elastic or flexible material 21 and a rigid frame 22. Material 21 has a surface 24 that contains a plurality of holes 23. As explained hereinafter, material 21 serves as a tray for holding components 10. When material 21 is relaxed or is not stretched, the size of holes 23 can be similar to the size of components 10, but holes 23 are preferably slightly smaller than the size of components 10 for reasons explained hereinafter. The spacing between each of holes 23 should be minimized to conserve space across material 21. Material 21 should be capable of withstanding high temperatures without outgassing contaminants or otherwise damaging components 10. As an example, material 21 can be approximately one to five millimeters thick and can be comprised of an elastic or flexible polymer such as, for example, silicone rubber that can be stretched and that can "grip" or "hold onto" components 10 as explained hereinafter.

Frame 22 includes pins or posts 25 that extend into holes around a perimeter of material 21 in order to rigidly support elastic material 21. Posts 25 are positioned around a periphery of frame 22 to stretch material 21 in a plurality of directions. Posts 25 can also serve as alignment markers during subsequent manufacturing steps. Similar to material 21, frame 22 should also be capable of withstanding high temperatures. Frame 22 can be comprised of stainless steel, carbon-fiber-filled plastic, or the like.

Ends 15 of components 10 are positioned or inserted into holes 23 of material 21 such that opposite ends 14 of components 10 are exposed. Components 10 can be inserted into holes 23 using an automated or manual process. As an example, a two step process can be used to insert components 10 into holes 23. During the first step, only the tip of ends 15 are individually placed into holes 23, and then during the second step, all of components 10 can be simultaneously pushed further into holes 23. Holes 23 preferably have flared openings at surface 24 to facilitate the insertion of components 10. Frame 22 can be used to stretch material 21 to widen holes 23 during the insertion of components 10. After the insertion of components 10, material 21 can be slightly relaxed to more effectively "grip" components 10. Material 21 preferably remains slightly stretched even after the insertion of components 10 to prevent the buckling or distortion of material 21 during the elevated temperatures of subsequent manufacturing steps. Therefore, holes 23 are preferably smaller than components 10 so that when material 21 is stretched, holes 23 are the correct size and are not too big for supporting components 10. An adhesive between material 21 and frame 22 is not required so that material 21 can be stretched and so that material 21 can be removed from frame 22 and used to transport components 10, as explained in more detail hereinafter.

Holes 23 in material 21 can extend through the entire thickness of material 21 such that components 10 contact frame 22 when inserted into holes 23. However, if desired, the depth of holes 23 can alternatively be less than the thickness of material 21. The position of components 10 within holes 23 forms an angle between surface 13 of substrate 11 and surface 24 of material 21. The angle is typically greater than approximately five degrees. In the preferred embodiment, surfaces 13 and 24 are perpendicular to each other such that the angle formed between them is approximately ninety degrees. In this preferred embodiment, holes 23 have a depth such that ends 14 of components 10 are substantially planar with surface 24 of material 21. The preferred angle and depth of holes 23 facilitates subsequent manufacturing processes as explained hereinafter. In an alternative embodiment, surface 24 of material 21 can be lower than ends 14 of components 10 if adjacent ones of components 10 are desired to be subsequently packaged together, as discussed hereinafter. In yet another alternative embodiment, surface 24 can be higher than ends 14 if more packaging material is required to improve the stability of components 10, as discussed hereinafter.

Figure 3:
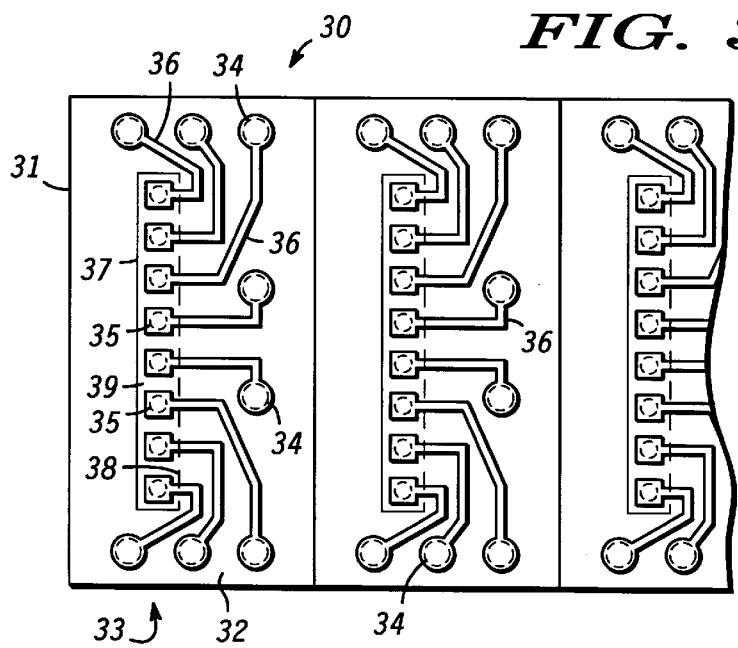
FIG. 3 represents a partial top view of an interconnect substrate in accordance with the present invention.

FIG. 3 represents a partial top view of an interconnect substrate 30 that includes an electrically insulative material 31 having opposite surfaces 32 and 33 and a plurality of vias 34 and 35 extending therebetween. Material 31 should be capable of withstanding certain elevated temperatures during subsequent processing. As an example, material 31 can be comprised of an elastic or flexible electrical insulator such as, for example, polyimide or Mylar™ and can have a thickness of approximately twenty to one hundred microns. When material 31 is elastic or flexible, the thermal expansion of material 31 is less of a concern for components 10.

Substrate 30 also includes electrically conductive traces or a patterned metal layer 36 located over or adjacent to surface 32. Layer 36 also overlies vias 34 and 35, which are formed after the patterning of layer 36. Layer 36 can have a thickness of approximately ten to twenty microns, can have a width of approximately fifty to one hundred microns, and can be comprised of plated, evaporated, or sputtered copper or other suitable electrically conductive material. Although not depicted in FIG. 3, a plurality of electrically conductive contacts can be formed over surface 33 of material 31 and in vias 35. The contacts are electrically coupled to layer 36 through vias 35. As an example, vias 35 can have a diameter of approximately two hundred to three hundred microns. The undepicted electrical contacts over surface 33 of material 31 can be comprised of a solderable material such as, for example, indium lead and are described in more detail hereinafter.

After formation of the contacts on surface 33, material 31 is cut along a solid line 37 and is folded or bent along a dashed line 38 such that a flap or portion 39 of material 31 is moved away from surface 33 of material 31. Material 31 should not be too thick, to prevent material 31 from being damaged by the bending of portion 39. Layer 36 on portion 39 assists portion 39 in maintaining its bent configuration. By cutting and bending portion 39, a hole or via (not shown) is formed in material 31 adjacent to portion 39 and that extends between surfaces 32 and 33 of material 31. The cutting of material 31 can be accomplished using a laser, stamping, or punching tool known in the art.

Figure 4:
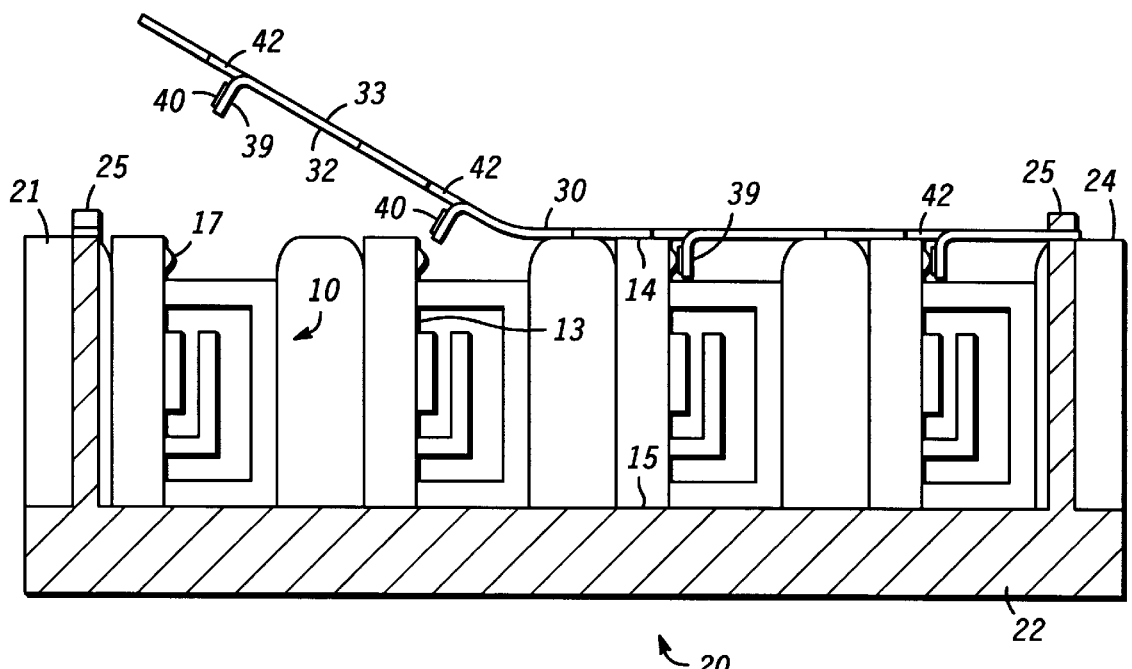
FIG. 4 depicts a cross-sectional view of an embodiment of the positioning of the interconnect substrate over the plurality of electronic components in accordance with the present invention.

FIG. 4 depicts a cross-sectional view of an embodiment of the positioning of substrate 30 over components 10. It is understood that the same reference numerals are used in the figures to denote the same elements. The depicted views of substrate 30 in FIG. 4 and in subsequent figures are simplified to facilitate the explanation of FIG. 4 and the subsequent figures. For reasons explained hereinafter, substrate 30 is preferably positioned such that surface 32 faces towards ends 14 of components 10, such that portion 39 of substrate 30 extends towards components 10, and such that substrate 30 is substantially parallel to surface 24 of material 21. However, in an alternative embodiment, surface 33 of substrate 30 can face towards components 10 if desired.

FIG. 4 also depicts a plurality of electrically conductive contacts 40 that are located in vias 35 of portions 39 as previously described, but not shown, in FIG. 3. Posts 25 are placed through perimeter holes of substrate 30 such that contacts 40 of substrate 30 are aligned to contacts 17 of components 10. When portions 39 of substrate 30 are bent approximately ninety degrees from surface 32 of substrate 30 and when substrate 30 is substantially parallel to surface 24 of material 21, the alignment of contacts 17 and 40 is facilitated by the parallel relationship between portions 39 and surface 13 of components 10. As a result of bending portions 39, a plurality of holes 42 are formed in substrate 30.

Figure 5:
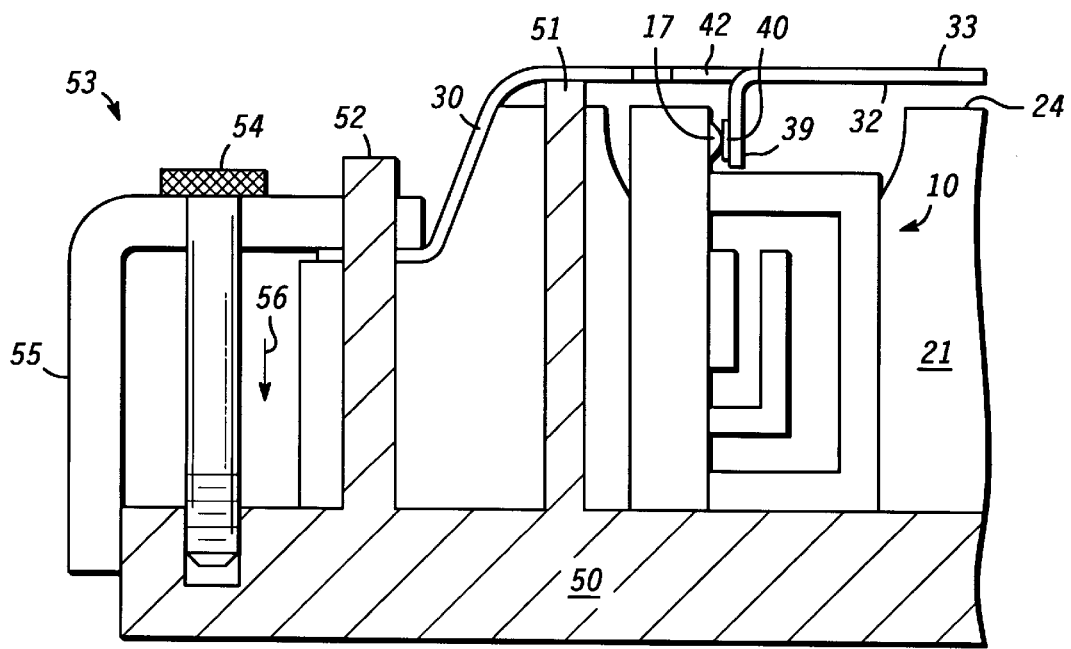
FIG. 5 depicts a partial cross-sectional view of an alternative embodiment of the positioning of the interconnect substrate over the plurality of electronic components in accordance with the present invention.

FIG. 5 depicts a partial cross-sectional view of an alternative embodiment of the positioning of substrate 30 over components 10. A rigid frame 50 is similar to frame 22 (FIGS. 2 and 4), but frame 50 has a few additional components including pins or posts 51 and 52 and a clamping mechanism 53. Similar to posts 25 (FIG. 2), posts 51 and 52 in FIG. 5 are positioned around a periphery of frame 50. Also similar to posts 25 (FIG. 2), posts 51 in FIG. 5 support material 21. However, different from posts 25 (FIG. 2), posts 51 do not extend through holes of substrate 30. Posts 52 are placed through the perimeter holes in substrate 30 and are also placed through a hole in a bar 55. Clamping mechanism 53 includes bar 55 and a screw 54, which are used to modify the tension of substrate 30. As screw 54 is twisted to move in a direction indicated by an arrow 56, bar 55 is also moved in the same direction. Consequently, bar 55 stretches substrate 30 by pushing an end portion of substrate 30 towards material 21. The stretching of substrate 30 can be used to accurately align contacts 40 of substrate 30 to contacts 17 of components 10, by changing both the center location and the pitch of the array of contacts 40 on substrate 30. Relative to the bottom of frame 50, the height of clamping mechanism 53 should be lower than the height of substrate 30 so that frame 50 is compatible with subsequent screen printing processes. It is understood that screw 54 can be replaced with other appropriate movable devices. Although only one clamping mechanism 53 is illustrated in FIG. 5, it is understood that frame 50 can have a plurality of clamping mechanisms around the perimeter of frame 50 for more accurate alignment of substrate 30.

After the positioning and alignment of substrate 30, contacts 17 and 40 are cured or annealed. When contacts 17 and 40 are comprised of gold and indium lead solder, respectively, a temperature of approximately two hundred forty to two hundred seventy degrees Celsius can be used to reflow the solder and form the electrical contact. When layer 36 is comprised of copper and is formed on surface 32 of substrate 30, the heat from the electrical contact curing may cause layer 36 to deform or relax. Therefore, in order to ensure proper formation of the electrical contact between contacts 17 and 40, layer 36 and surface 32 of substrate 30 preferably face towards components 10. In this preferred embodiment, if layer 36 relaxes or deforms as a result of elevated processing temperatures, layer 36 will tend to relax or move toward contact 17 and will apply more pressure between contacts 17 and 40. Thus, contacts 17 and 40 will not become physically separated because of the relaxation of layer 36, and the fabrication yield of components 10 can be significantly improved.

Figure 6:
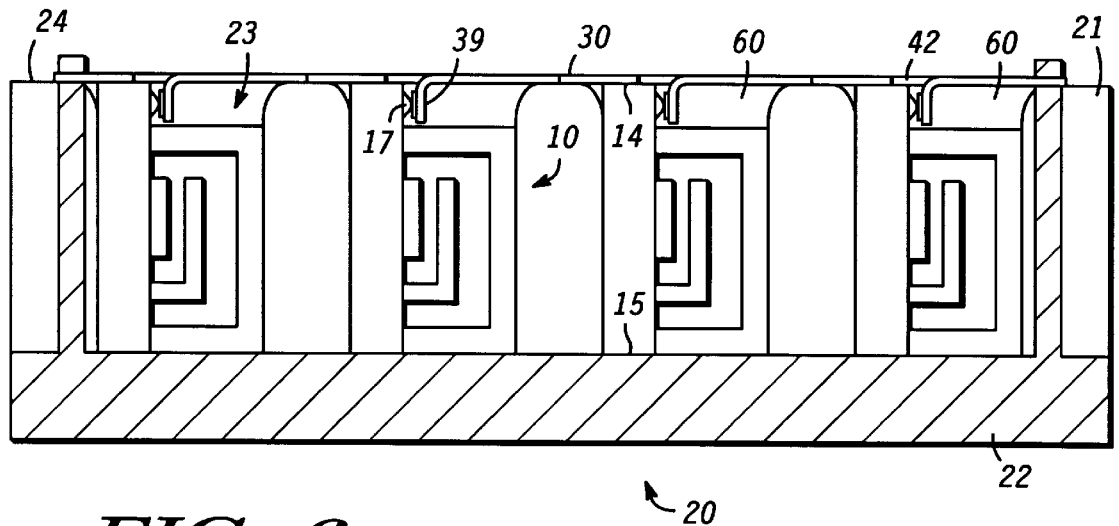
FIGS. 6–10 illustrate cross-sectional views of the plurality of electronic components during subsequent manufacturing and testing steps in accordance with the present invention.

FIGS. 6–10 illustrate cross-sectional views of components 10 during subsequent manufacturing and testing steps. In FIG. 6, a packaging material, underfill, or encapsulant 60 is disposed into holes 23 of material 21 through holes 42 of substrate 30. The preferred flared openings of holes 23 can serve as a mold plate to shape encapsulant 60. Alternatively, capillary action can be used to shape encapsulant 60. In either case, encapsulant 60 should be adjacent to, cover, or encapsulate ends 14 of components 10, contacts 17 of components 10, portions 39 of substrate 30, and contacts 40 of substrate 30. When ends 14 are substantially planar with surface 24 of material 21, encapsulant 60 can serve as an adhesive between surface 24 of material 21 and surface 32 of substrate 30. Encapsulant 60 is not formed around or is absent around ends 15 of components 10 because the bottom portion of holes 23 is preferably only wide enough for one of components 10. As depicted in FIG. 6, a screen printing technique or other appropriate process can be used to provide encapsulant 60. As an example, encapsulant 60 can be comprised of an epoxy underfill such as, for example, HYSOL™ 4510 or HYSOL™ 4511 that are commercially available from Dexter Corporation of Olean, N.Y.

Figure 7:
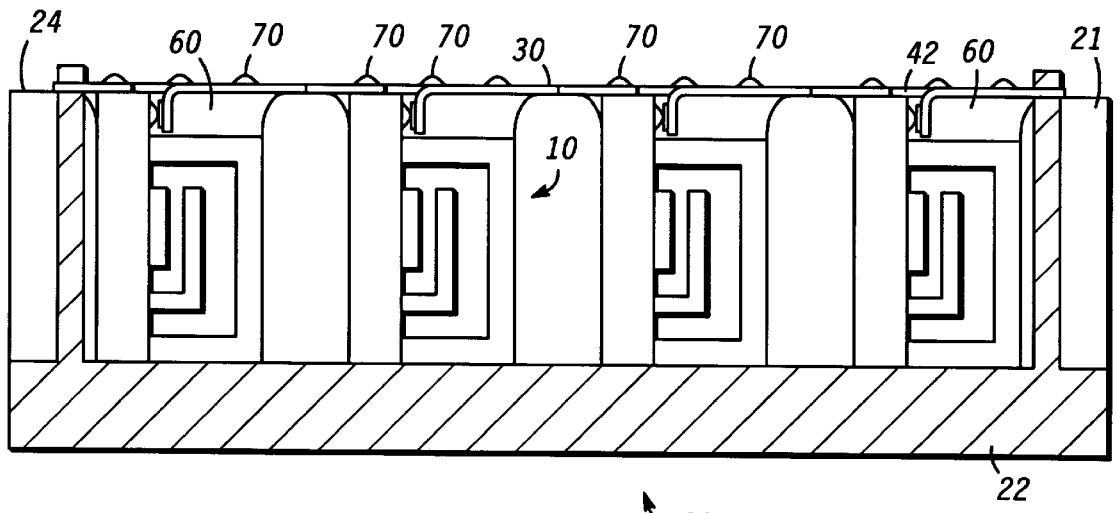

Next, FIG. 7 illustrates a plurality of conductive contacts 70 being formed over substrate 30. More specifically, contacts 70 are formed in vias 34 (not shown in FIG. 7) of substrate 30; vias 34 are more clearly shown in FIG. 3. Contacts 70 can each have a size of approximately two hundred to three hundred microns and a pitch of approximately four hundred to six hundred microns. Similar to encapsulant 60, contacts 70 can be formed using a screen printing technique or other appropriate process. In the preferred embodiment where electrically conductive layer 36 is formed adjacent to surface 32 and where surface 32 faces towards components 10, a solder or other mask is not needed during the formation of contacts 70 because layer 36 is only exposed by vias 34 of substrate 30. Therefore, in the preferred embodiment, the fabrication process for components 10 is simplified. When encapsulant 60 and contacts 70 are comprised of an epoxy underfill and an eutectic solder paste, respectively, encapsulant 60 and contacts 70 can be simultaneously cured and reflowed at a temperature of approximately two hundred to two hundred twenty degrees Celsius without damaging the previously formed electrical connection between contacts 17 and 40. Alternatively, encapsulant 60 can be cured prior to the formation of contacts 70.

Figure 8:
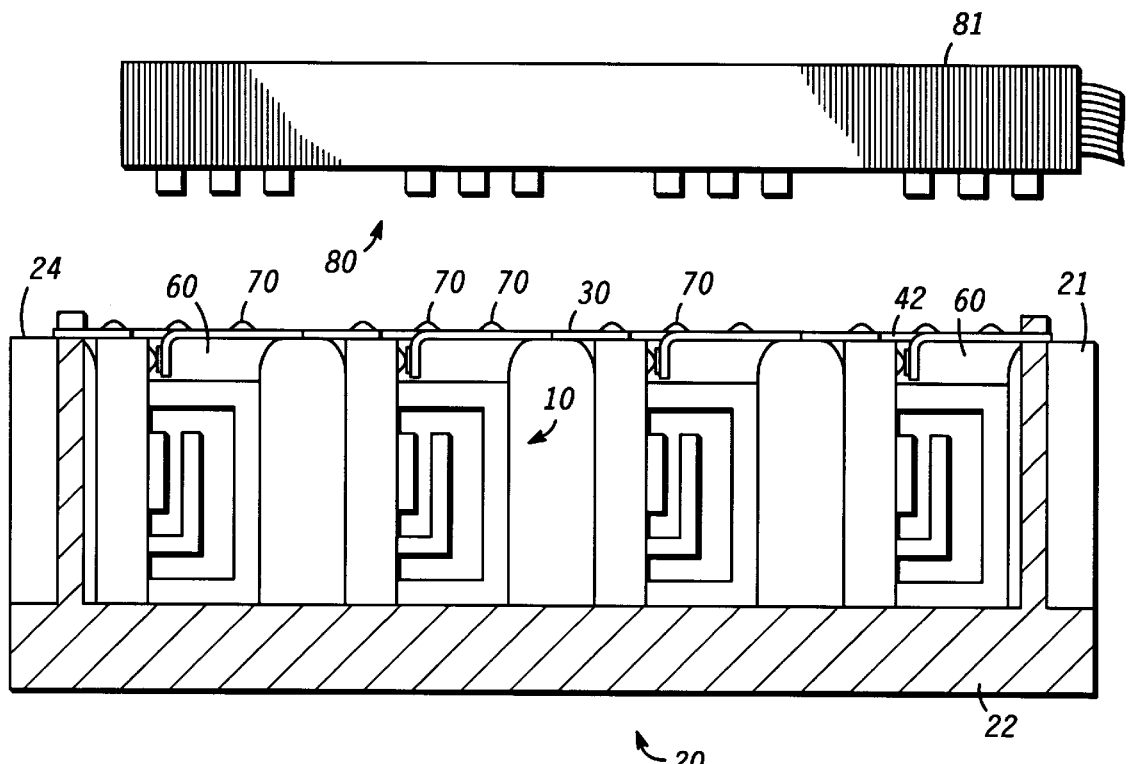

In FIG. 8, components 10 are electrically tested by a tester 80. A single probe card 81 can be used to simultaneously test all of components 10 that are held by carrier 20 in accurate alignment.

Figure 9:
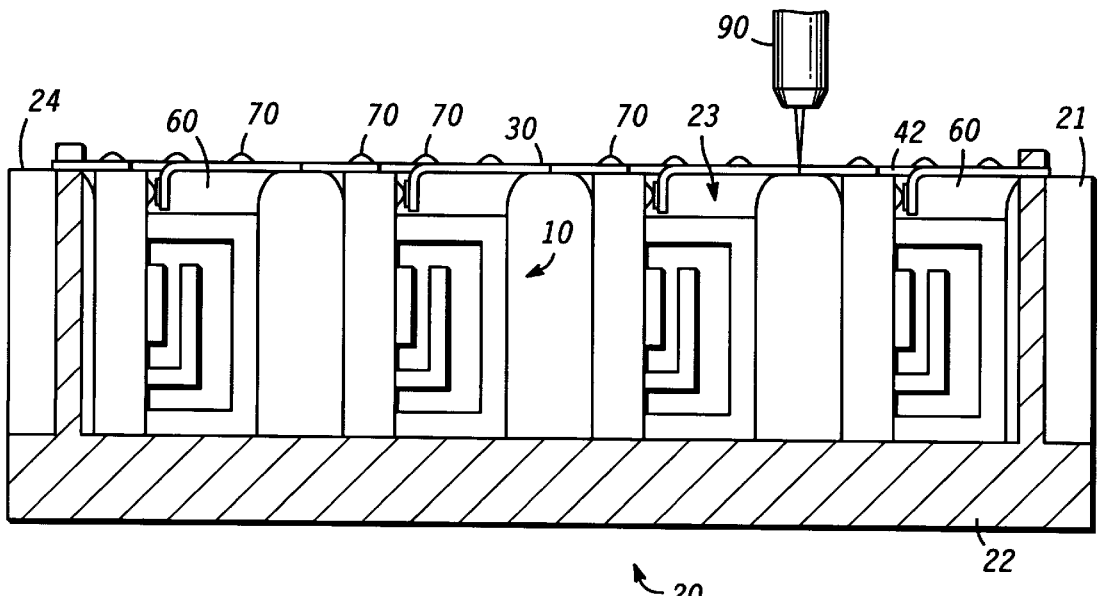
Figure 10:
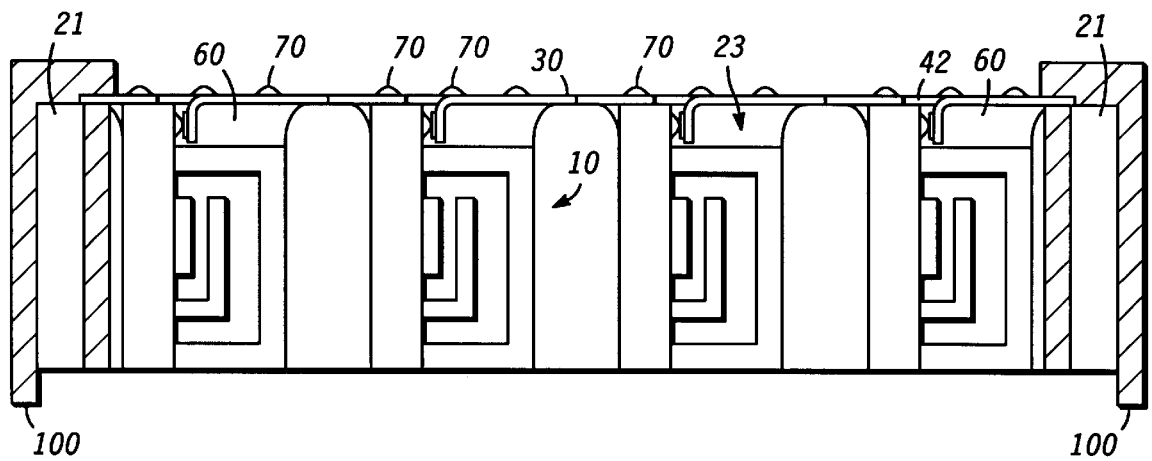

FIG. 9 portrays a tool 90 cutting or excising substrate 30 to separate the individual components 10 from each other. Subsequently, material 21 can be removed or separated from frame 22 while keeping components 10 within holes 23. Thus, as represented in FIG. 10, material 21 can be used as a portion of a shipping tray 100 for transporting components 10. When material 21 is comprised of silicon rubber and when holes 23 are slightly smaller than the size of components 10, material 21 can prevent components 10 from shifting around during transport, as commonly occurs in conventional shipping trays. Next, some of components 10 can be removed from holes 23 and aligned and mounted over an assembly board.

Figure 11:
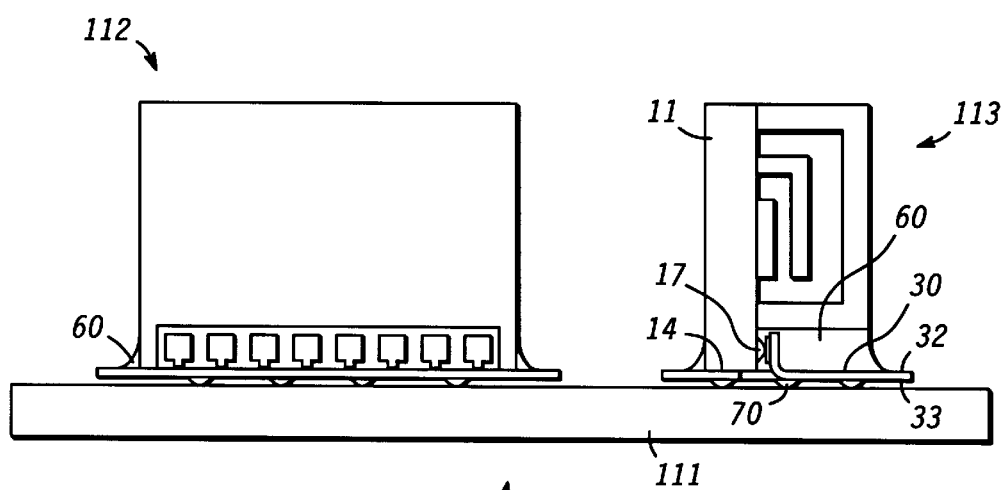
FIG. 11 portrays a partial cross-sectional view of an embodiment of electronic components mounted over an assembly substrate in accordance with the present invention.

FIG. 11 portrays a partial cross-sectional view of an embodiment of components 112 and 113 mounted over an assembly substrate 111 to form an electronic component 110. Components 112 and 113 are selected from components 10 in FIG. 10. The completed size of each of components 112 and 113 can be approximately one to three millimeters wide, approximately three to five millimeters long, and approximately three to five millimeters high. Components 112 and 113 should include sufficient amounts of encapsulant 60 so that components 112 and 113 are capable of standing on ends 14 without easily tipping over. In the preferred embodiment where components 112 and 113 are micromachined accelerometers, components 112 and 113 can be mounted perpendicular to each other, as shown in FIG. 11, to form a multi-directional accelerometer that can sense motion in two different directions. Devices 16 are electrically coupled to substrate 111 through contacts 17, contacts 40, patterned metal layer 36 (not shown in FIG. 11), and contacts 70. Substrate 111 can be similar to conventional personal computer (p.c.) boards or other assembly boards used in the art of electronics. One skilled in the art will recognize that substrate 111 of component 114 can be much smaller than the prior art because components 112 and 113 are mounted on an edge surface such that end 14 of substrate 11 and surface 33 of substrate 30 face toward substrate 111. Thus, substrate 30 is approximately parallel to substrate 111, and substrate 11 is approximately perpendicular to substrate 111.

Figure 12:
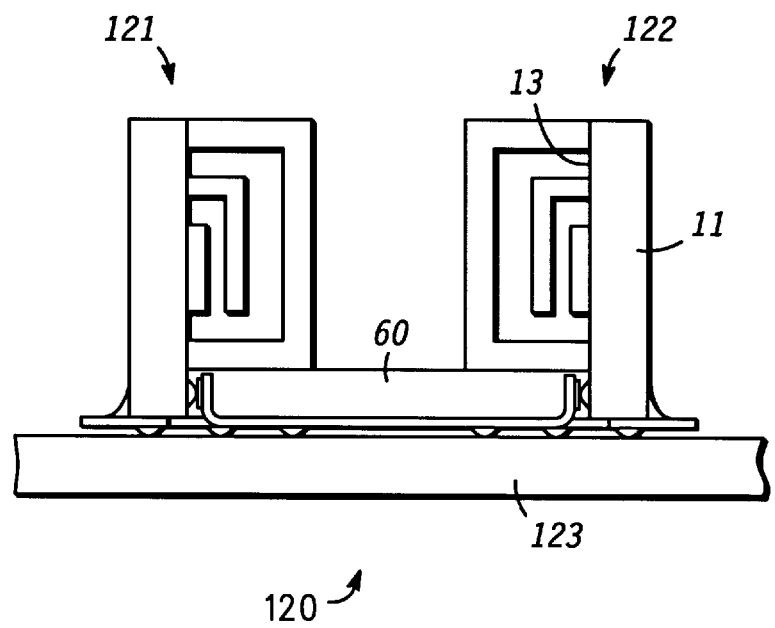
FIG. 12 portrays a partial cross-sectional view of an alternative embodiment of electronic components mounted over an assembly substrate in accordance with the present invention.

FIG. 12 portrays a partial cross-sectional view of an electronic component 120, which is an alternative embodiment of component 110 in FIG. 11. In FIG. 12, components 121 and 122 can be similar to components 10 in shipping tray 100 (FIG. 10). Assembly board 123 can be similar to substrate 111 in FIG. 11. In FIG. 12, components 121 and 122 are parallel to each other and are mirror images of each other. In this alternative embodiment, when components 121 and 122 are accelerometers, one skilled in the art will recognize that component 120 can serve as a differential accelerometer. It is noted that components 121 and 122 are contained by a single package which can be formed by modifying holes 23 (FIG. 6) in material 21 and by lowering the height of surface 24 (FIG. 6) of material 21. Therefore, components 121 and 122 form a single multi-chip module (MCM). However, it is understood that components 121 and 122 can also be packaged separately. Similar to FIG. 11, surfaces 13 of substrates 11 in components 121 and 122 form an approximate ninety degree angle with board 123 to conserve space across board 123. However, it is understood that the angle can be any angle greater than approximately five degrees.

Therefore, it is apparent there has been provided an improved method of manufacturing an electronic component that overcomes the disadvantages of the prior art. The fabrication method is not complicated, is cost-effective, and is manufacturable. The manufacturing cost for the electronic component is lowered because several components are simultaneously manufactured or assembled, and this batch processing reduces the number of steps required to produce a given quantity of components. The manufacturing cost can also be lowered by using the fine tuning or adjustment technique shown in FIG. 5 or any equivalent technique that can improve manufacturing yields. Additionally, the manufacturing cost is further reduced because of the footprint reduction on an assembly board.

While the invention has been particularly shown and described with reference to preferred embodiments, it will be understood by those skilled in the art that changes in form and detail may be made without departing from the spirit and scope of the invention. For instance, the numerous details set forth herein such as, for example, chemical compositions of contacts 17 (FIG. 1) and contacts 40 (FIG. 4) and the specific details of substrate 30 are provided to facilitate the understanding of the present invention and are not provided to limit the scope of the invention. As another example, the concepts related to the manufacturing process and the assembly board components can also be applied to integrated circuits, multi-chip modules, electrostatic relays, memory devices, or the like. Furthermore, ends 14 of components 10 and surface 24 of material 21 can also be used to support substrate 30 during the manufacturing process. Accordingly, the disclosure of the present invention is not intended to be limiting. Instead, the disclosure of the present invention is intended to be illustrative of the scope of the invention, which is set forth in the following claims.

I claim:

1. A method of manufacturing an electronic component comprising:
    providing a device substrate having a device surface with a first end and a second end opposite the first end, the device substrate comprised of a semiconductor substrate;
    using the device substrate to support an electronic device;
    using the device surface to support a plurality of electrical contacts coupled to the electronic device;
    providing a carrier having a carrier surface with a plurality of holes;
    inserting the first end of the device substrate into one of the plurality of holes wherein the device surface and the carrier surface are substantially non-parallel to each other;
    providing an interconnect substrate with a first surface and a flap partially excised from a portion of the first surface; and
    positioning the first surface of the interconnect substrate over the second end of the device substrate and substantially parallel with the carrier surface to align the flap to the plurality of electrical contacts.

2. The method of claim 1 wherein the positioning step further comprises electrically coupling the interconnect substrate electrically coupled to the electronic device.

3. The method of claim 1 wherein the interconnect substrate has a plurality of holes and further comprising the steps of:
    disposing a packaging material into one of the plurality of holes to encapsulate the second end of the device substrate; and
    electrically testing the electronic device while the device substrate remains in the one of the plurality of holes wherein the electrically testing step occurs after the disposing step.

4. The method of claim 1 wherein providing the device substrate further includes providing an edge surface adjacent to the second end of the device surface and wherein inserting the first end of the device substrate into the one of the plurality of holes includes providing the edge surface of the device substrate approximately planar with the carrier surface.

5. A method of manufacturing an electronic component comprising:
    providing a device substrate having a device surface with a first end and a second end opposite the first end;
    using the device surface to support an electronic device and a plurality of electrical contacts coupled to the electronic device;
    providing a carrier having a carrier surface with a plurality of holes;
    inserting the first end of the device substrate into one of the plurality of holes wherein the device surface and the carrier surface form an angle; and
    positioning an interconnect substrate over the second end of the device substrate wherein the interconnect substrate is electrically coupled to the electronic device, wherein positioning the interconnect substrate further comprises:
        providing the interconnect substrate with a first surface, a second surface opposite the first surface, and a flap; and
        aligning the flap to the plurality of electrical contacts.

6. A method of manufacturing an electronic component comprising:
    providing a device substrate having a device surface with a first end and a second end opposite the first end;
    using the device surface to support an electronic device and a plurality of electrical contacts coupled to the electronic device;
    providing a carrier having a carrier surface with a plurality of holes;
    inserting the first end of the device substrate into one of the plurality of holes wherein the device surface and the carrier surface form an angle;
    positioning an interconnect substrate over the second end of the device substrate wherein the interconnect substrate is electrically coupled to the electronic device, wherein positioning the interconnect substrate includes providing the interconnect substrate with a plurality of holes; and
    disposing an encapsulant around the second end of the device surface by disposing the encapsulant into the plurality of holes of the interconnect substrate.

7. The method of claim 6 wherein disposing the encapsulant includes using the encapsulant to adhere the interconnect substrate to the second end of the device substrate.

8. A method of manufacturing an electronic component comprising:
providing a device substrate having a device surface with a first end and a second end opposite the first end;
using the device surface to support an electronic device and a plurality of electrical contacts coupled to the electronic device;
providing a carrier having a carrier surface with a plurality of holes;
inserting the first end of the device substrate into one of the plurality of holes wherein the device surface and the carrier surface form an angle, wherein using the device surface to support the electronic device includes providing a micromachined sensor for the electronic device; and
positioning an additional substrate over the micromachined sensor wherein inserting the first end of the device substrate into the one of the plurality of holes includes simultaneously inserting the additional substrate into the one of the plurality of holes.

9. A method of manufacturing an electronic component comprising:
providing a substrate with a device surface and an end adjacent to the device surface, the substrate comprised of a semiconductor substrate;
providing an electronic device supported by the substrate;
providing electrical contacts supported by the device surface and electrically coupled to the electronic device;
providing a carrier having a carrier surface with a hole;
forming an angle between the device surface and the carrier surface by inserting the substrate into the hole wherein the device surface and the carrier surface are substantially non-parallel to each other; and
electrically coupling an interconnect substrate to the electronic device by aligning the interconnect substrate over the end of the substrate.

10. The method of claim 9 wherein the step of forming the angle includes positioning the substrate in the hole such that the end of the substrate is substantially coplanar with the carrier surface.

11. A method of manufacturing an electronic component comprising:
providing a substrate with a device surface and an end adjacent to the device surface;
providing an electronic device supported by the device surface;
providing a carrier having a carrier surface with a hole;
forming an angle between the device surface and the carrier surface by inserting the substrate into the hole;
electrically coupling an interconnect substrate to the electronic device by aligning the interconnect substrate over the end of the substrate;
removing the substrate from the hole;
aligning the interconnect substrate to an assembly substrate; and
using the interconnect substrate to electrically couple the assembly substrate and the electronic device wherein the interconnect substrate is approximately parallel to the assembly substrate and wherein an angle between the device surface and the interconnect substrate is greater than approximately five degrees.

12. A method of manufacturing an electronic component comprising:
providing a substrate with a device surface and an end adjacent to the device surface;
providing an electronic device supported by the device surface;
providing a carrier having a carrier surface with a hole;
forming an angle between the device surface and the carrier surface by inserting the substrate into the hole; and
electrically coupling an interconnect substrate to the electronic device by aligning the interconnect substrate over the end of the substrate,
wherein forming the angle between the device surface and the carrier surface includes providing an angle of approximately ninety degrees for the angle between the device surface and the carrier surface and wherein electrically coupling the interconnect substrate to the electronic device includes positioning the interconnect substrate approximately parallel to the carrier surface.

13. A method of manufacturing an electronic component comprising:
providing a substrate with a device surface and an end adjacent to the device surface;
providing an electronic device supported by the device surface;
providing a carrier having a carrier surface with a hole;
forming an angle between the device surface and the carrier surface by inserting the substrate into the hole; and
electrically coupling an interconnect substrate to the electronic device by aligning the interconnect substrate over the end of the substrate,
wherein providing the carrier further comprises:
providing a flexible carrier having the carrier surface with the hole;
providing a rigid carrier; and
using the rigid carrier to support the flexible carrier.

14. The method of claim 13 further comprising transporting the electronic device by separating the flexible carrier from the rigid carrier and keeping the substrate in the hole.

15. A method of manufacturing an electronic component comprising:
providing a substrate with a device surface and an end adjacent to the device surface;
providing an electronic device supported by the device surface;
providing a carrier having a carrier surface with a hole;
forming an angle between the device surface and the carrier surface by inserting the substrate into the hole; and
electrically coupling an interconnect substrate to the electronic device by aligning the interconnect substrate over the end of the substrate, wherein providing the carrier includes providing a flared opening for the hole and wherein electrically coupling the interconnect substrate to the electronic device includes providing the interconnect substrate with a via; and
encapsulating a portion of the substrate by disposing an encapsulant into the via and into the flared opening.

16. A method of manufacturing an electronic component comprising:
providing a semiconductor substrate having a device surface;
fabricating a plurality of semiconductor devices in the semiconductor substrate wherein each of the plurality of semiconductor devices has a plurality of electrical bumps overlying the device surface;

singulating the plurality of semiconductor devices;

providing a flexible carrier having a carrier surface with a plurality of holes;

using a rigid frame to stretch the flexible carrier;

positioning each of the plurality of semiconductor devices into a different one of the plurality of holes wherein the device surface of at least one of the plurality of semiconductor devices form an angle with the carrier surface wherein the angle is greater than approximately five degrees;

aligning an interconnect substrate to the plurality of electrical bumps;

forming a plurality of conductive bumps over the interconnect substrate; and cutting the interconnect substrate.

17. The method of claim 16 further comprising removing the flexible carrier from the rigid frame while keeping the plurality of semiconductor devices in the plurality of holes.

18. The method of claim 16 further comprising electrically testing the plurality of semiconductor devices prior to cutting the interconnect substrate.

19. The method of claim 16 wherein aligning the interconnect substrate comprises:

using the rigid frame to support the interconnect substrate; and stretching the interconnect substrate.

20. The method of claim 16 wherein aligning the interconnect substrate includes providing the interconnect substrate with a plurality of vias and further comprising forcing an encapsulant through the plurality of vias.

21. The method of claim 16 wherein aligning the interconnect substrate includes positioning the interconnect substrate approximately perpendicular to the device surface.

* * * * *

UNITED STATES PATENT AND TRADEMARK OFFICE
CERTIFICATE OF CORRECTION

PATENT NO.   : 5,860,210
DATED        : January 19, 1999
INVENTOR(S)  : George W. Hawkins It is certified that error appears in the above-identified patent and that said Letters Patent is hereby corrected as shown below:

Column 8,
Line 3, delete "electrically coupled".

Signed and Sealed this

Eleventh Day of June, 2002

Attest:

Attesting Officer

JAMES E. ROGAN
*Director of the United States Patent and Trademark Office*